(12) United States Patent
Hara et al.

(10) Patent No.: US 12,174,263 B2
(45) Date of Patent: Dec. 24, 2024

(54) BATTERY INSPECTION METHOD AND BATTERY INSPECTION SYSTEM

(71) Applicant: TOYOTA JIDOSHA KABUSHIKI KAISHA, Toyota (JP)

(72) Inventors: Ruri Hara, Toyota (JP); Toshinori Okura, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 125 days.

(21) Appl. No.: 17/994,199

(22) Filed: Nov. 25, 2022

(65) Prior Publication Data

US 2023/0221376 A1 Jul. 13, 2023

(30) Foreign Application Priority Data

Jan. 11, 2022 (JP) ................................. 2022-002264

(51) Int. Cl.
*G01R 31/392* (2019.01)
*G01R 31/3842* (2019.01)

(52) U.S. Cl.
CPC ....... *G01R 31/392* (2019.01); *G01R 31/3842* (2019.01)

(58) Field of Classification Search
None
See application file for complete search history.

(56) References Cited

U.S. PATENT DOCUMENTS

| | | | |
|---|---|---|---|
| 2014/0049227 A1* | 2/2014 | Martin | H02J 7/00 320/162 |
| 2018/0080995 A1* | 3/2018 | Heinen | G01R 31/44 |
| 2019/0011502 A1 | 1/2019 | Kobayashi et al. | |
| 2019/0067757 A1 | 2/2019 | Kohlberger et al. | |
| 2019/0198942 A1 | 6/2019 | Kobayashi et al. | |
| 2020/0110134 A1* | 4/2020 | Li | G01R 31/374 |

FOREIGN PATENT DOCUMENTS

| | | |
|---|---|---|
| CN | 111965545 A | 11/2020 |
| JP | 2014-134395 A | 7/2014 |
| JP | 2016-021300 A | 2/2016 |

(Continued)

*Primary Examiner* — Jas A Sanghera
(74) *Attorney, Agent, or Firm* — Oliff PLC

(57) ABSTRACT

The battery inspection method includes the following. Self-discharging the battery to be inspected until a predetermined time elapses from the start of self-discharging. Detecting a voltage, a current, a temperature of the battery and an ambient temperature when the predetermined time elapses. Perform a preliminary step prior to self-discharge of the battery. Obtain preliminary step information representing the execution conditions of the preliminary step. Calculating the current convergence value from the acquired preliminary step information, the detected voltage, current, and temperature, and the detected ambient temperature by referring to a predetermined correspondence between the preliminary step information, the voltage, current, and temperature of the battery at the time when the predetermined time elapses, the ambient temperature, and the current convergence value. Determining whether a short circuit failure of the battery has occurred based on the calculated current convergence value.

10 Claims, 6 Drawing Sheets

(56) References Cited

FOREIGN PATENT DOCUMENTS

| JP | 2019-016558 A | 1/2019 |
|----|---------------|--------|
| JP | 2019-113450 A | 7/2019 |
| JP | 2019-113469 A | 7/2019 |
| JP | 2020-038836 A | 3/2020 |
| JP | 2021-034348 A | 3/2021 |
| WO | 2016/009263 A1 | 1/2016 |

\* cited by examiner

FIG. 5

<<PRELIMINARY STEP INFORMATION>>

| RELEVANT PROCESS | EXPLANATORY VARIABLES (CONTENT OF PRELIMINARY STEP INFORMATION) |
|---|---|
| ASSEMBLY | ELECTRODE MATERIAL<br>ELECTRODE THICKNESS<br>WEIGHT PER UNIT AREA OF ELECTRODE<br>WATER CONTENT OF THE ELECTRODE<br>CAPACITANCE RATIO BETWEEN THE POSITIVE ELECTRODE AND THE NEGATIVE ELECTRODE<br>SEPARATOR MATERIAL |
| INJECTION | ELECTROLYTE MATERIAL<br>AMOUNT OF ELECTROLYTE INJECTED<br>INJECTION TIME OF THE ELECTROLYTE |
| PERMEATION | PERMEATION TIME |
| CHARGING | DWELL TIME FROM PERMEATION TO CHARGING<br>BATTERY TEMPERATURE DURING CHARGING<br>AMBIENT TEMPERATURE DURING CHARGING<br>VOLTAGE AT END OF CHARGE |
| HIGH TEMPERATURE AGING | RESIDENCE TIME FROM CHARGING TO HIGH TEMPERATURE AGING<br>HIGH TEMPERATURE AGING TIME<br>BATTERY VOLTAGE AT HIGH TEMPERATURE AGING<br>ENVIRONMENTAL VOLTAGE AT HIGH TEMPERATURE AGING |
| COOLING | COOLING TIME<br>RESIDENCE TIME FROM COOLING TO SELF-DISCHARGE<br>BATTERY TEMPERATURE DURING COOLING |

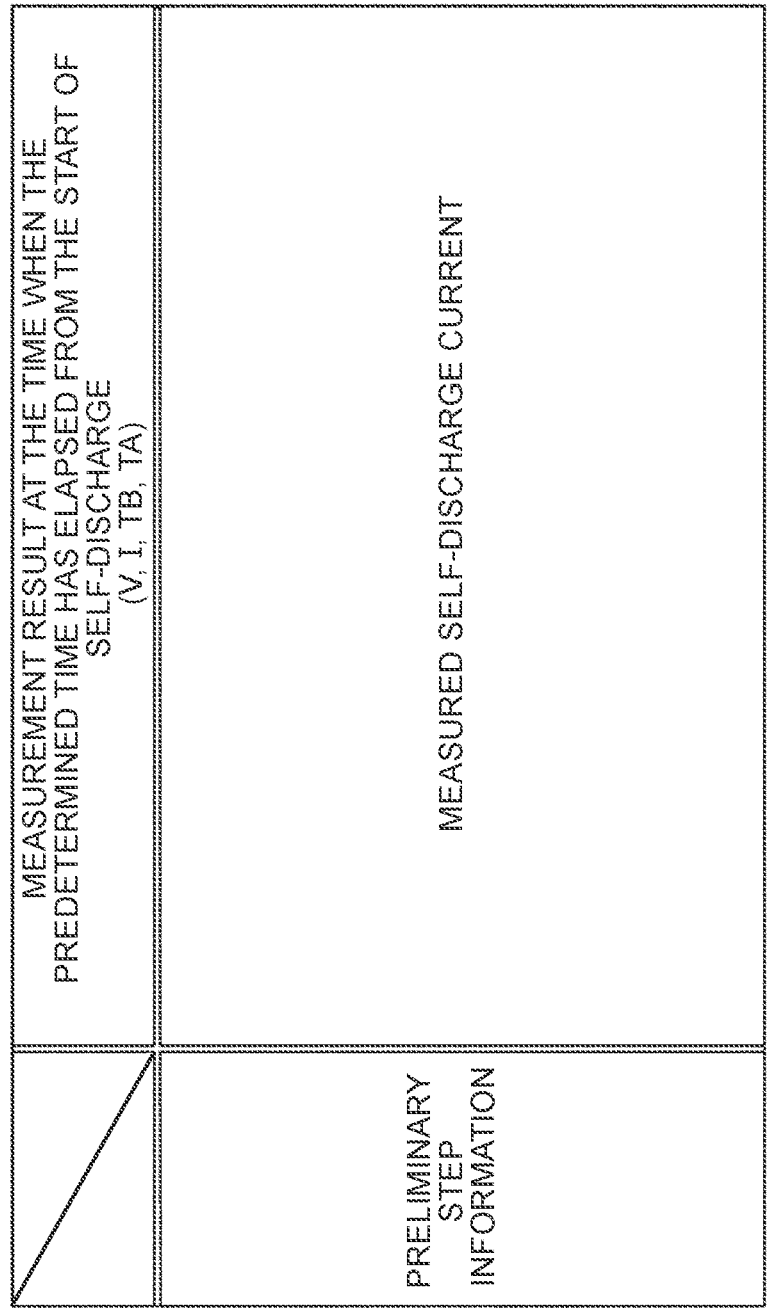

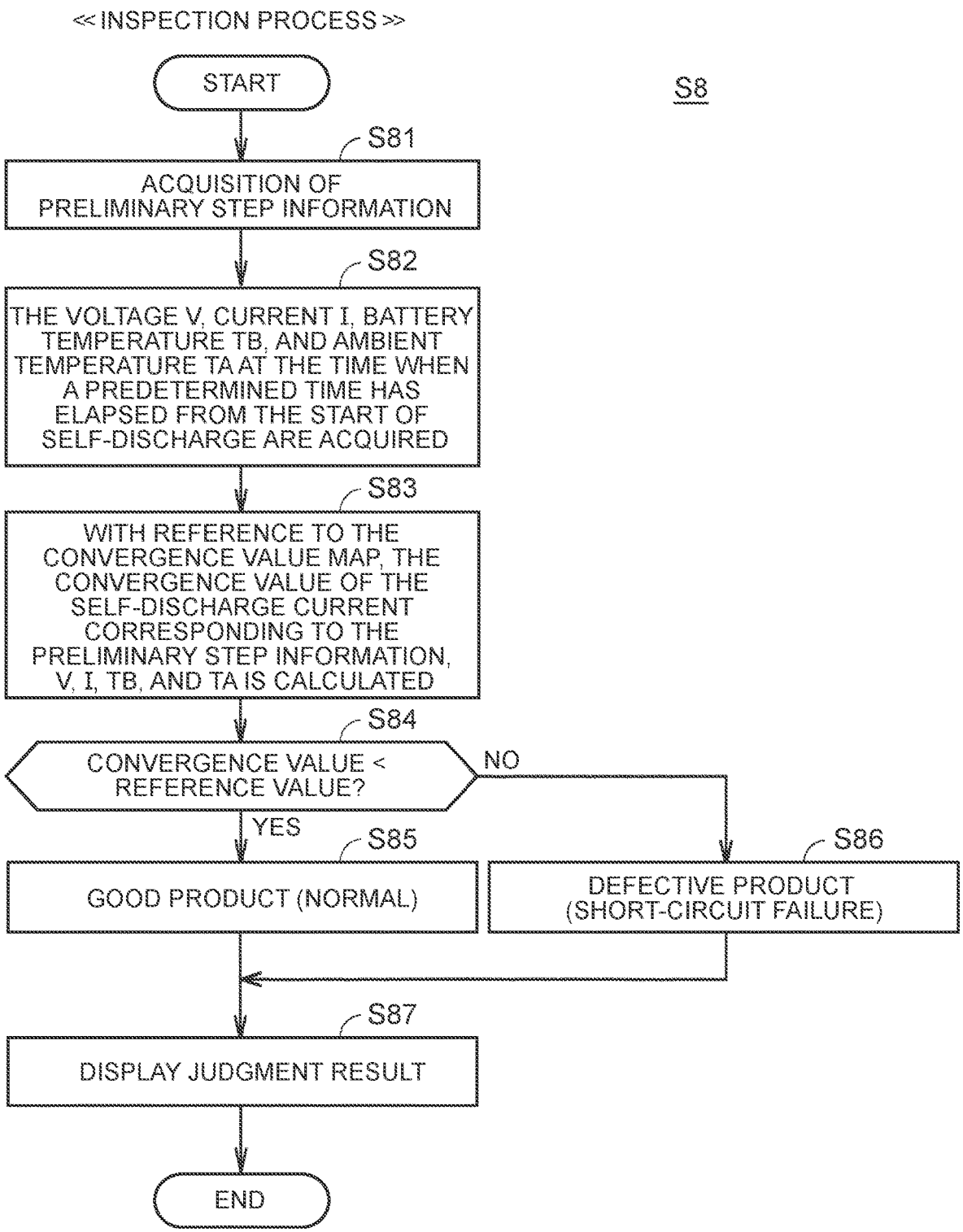

BATTERY INSPECTION METHOD AND BATTERY INSPECTION SYSTEM

CROSS-REFERENCE TO RELATED APPLICATION

This application claims priority to Japanese Patent Application No. 2022-002264 filed on Jan. 11, 2022, incorporated herein by reference in its entirety.

BACKGROUND

1. Technical Field

The present disclosure relates to a battery inspection method and a battery inspection system.

2. Description of Related Art

Techniques have been proposed for inspecting short circuit failures in a battery. For example, a battery inspection method disclosed in Japanese Unexamined Patent Application Publication No. 2019-113450 (JP 2019-113450) causes a current to flow in a direction in which a battery is charged or a direction in which the battery discharged, and determines a quality of the battery in accordance with a convergence state of the flowing current.

SUMMARY

It is conceivable to inspect the short-circuit failure of the battery based on a self-discharge current of the battery. When a convergence value of the self-discharge current after a predetermined time has elapsed is smaller than a reference value, the battery is determined to be normal, while when the convergence value is larger than the reference value, it can be determined that the short-circuit failure is occurring in the battery.

During the above-described inspection, the ambient temperature may change, and accordingly, the temperature of the battery may fluctuate. Then, there is a possibility that an appropriate inspection cannot be performed due to a change in a magnitude of the self-discharge current. For example, there is a possibility that the self-discharge current becomes difficult to converge and an inspection time becomes long.

The present disclosure has been made in order to solve the above problems, and an object of the present disclosure is to provide a technique capable of appropriately inspecting a short-circuit failure of a battery even when there is a temperature fluctuation of the battery.

A battery inspection method according to a first aspect of the present disclosure includes: self-discharging a battery to be inspected until a predetermined time has elapsed from a start of self-discharge; detecting a voltage, a current, and a temperature of the battery and an ambient temperature at a time when the predetermined time has elapsed; performing a preliminary step prior to self-discharge of the battery; acquiring preliminary step information representing an execution condition of the preliminary step; calculating a current convergence value from the acquired preliminary step information, the detected voltage, the detected current, the detected temperature, and the detected ambient temperature by referring to a predetermined correspondence between the preliminary step information, the voltage, the current, and the temperature of the battery, and the ambient temperature at the time when the predetermined time has elapsed, and the current convergence value; and determining whether a short circuit failure of the battery is occurring based on the calculated current convergence value.

In the battery inspection method according to the first aspect, performing the preliminary step may include injecting an electrolyte into a case containing an electrode assembly, and causing the injected electrolyte to permeate the electrode assembly.

In the battery inspection method according to the first aspect, the preliminary step information may include at least one of a material of the electrolyte, an injection amount of electrolyte, an injection time for injecting the electrolyte into the battery, and a permeation time for causing the electrolyte to permeate the electrode assembly.

In the battery inspection method according to the first aspect, performing the preliminary step may further include charging the battery after permeation of the electrolyte into the electrode assembly.

In the battery inspection method according to the first aspect, the preliminary step information may include at least one of a first residence time from permeation of the electrolyte to charging of the battery, the temperature of the battery when charging the battery, the ambient temperature when charging the battery, and the voltage of the battery at an end of charging of the battery.

In the battery inspection method according to the first aspect, performing the preliminary step may further include performing high temperature aging of the battery after the battery is charged.

In the battery inspection method according to the first aspect, the preliminary step information may include at least one of a second residence time from charging the battery to performing the high temperature aging, an execution time of the high temperature aging, a temperature of the battery in the high temperature aging, and an ambient temperature in the high temperature aging.

In the battery inspection method according to the first aspect, performing the preliminary step may further include cooling the battery after performing the high temperature aging.

In the battery inspection method according to the first aspect, the preliminary step information may include at least one of a cooling time of the battery, and a temperature of the cooled battery.

In the battery inspection method according to the first aspect, the battery may include a positive electrode, a negative electrode, and a separator. The preliminary step information may include at least one of a material of the positive electrode and the negative electrode, a thickness of the positive electrode and the negative electrode, a basis weight of the positive electrode and the negative electrode, a water content of the positive electrode and the negative electrode, a capacitance ratio between the positive electrode and the negative electrode, and a material of the separator.

The battery inspection system according to a second aspect of the present disclosure is configured to inspect a short-circuit failure of a battery in which a preliminary step is performed in accordance with preliminary step information. The battery inspection system includes: a voltage sensor that detects a voltage of the battery; a current sensor that detects a current flowing through the battery; a battery temperature sensor that detects a temperature of the battery; an ambient temperature sensor that detects an ambient temperature; a memory that stores a predetermined correspondence between the preliminary step information, the voltage, the current, and the temperature of the battery at a time when a predetermined time has elapsed from a start of self-discharge, the ambient temperature, and a current convergence value; and a processor that determines whether the short circuit failure of the battery is occurring. Here, the processor is configured as to: acquire the preliminary step information; acquire the voltage, the current, and the temperature of the battery, and the ambient temperature at a time when a predetermined time has elapsed since the self-discharge of the battery is started; calculate the current convergence value from the acquired preliminary step information, the detected voltage, the detected current, the detected temperature, and the detected ambient temperature by referring to the correspondence; and determine whether the short circuit failure of the battery is occurring based on the calculated current convergence value.

According to the present disclosure, it is possible to appropriately inspect a short-circuit failure of a battery even when there is a temperature fluctuation of the battery.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein:

FIG. 5 is a diagram for explaining preliminary step information;

FIG. 6 is a conceptual diagram of a convergence value map;

FIG. 7 is a flowchart illustrating a processing procedure of the inspection processing.

DETAILED DESCRIPTION OF EMBODIMENTS

Figure 1:
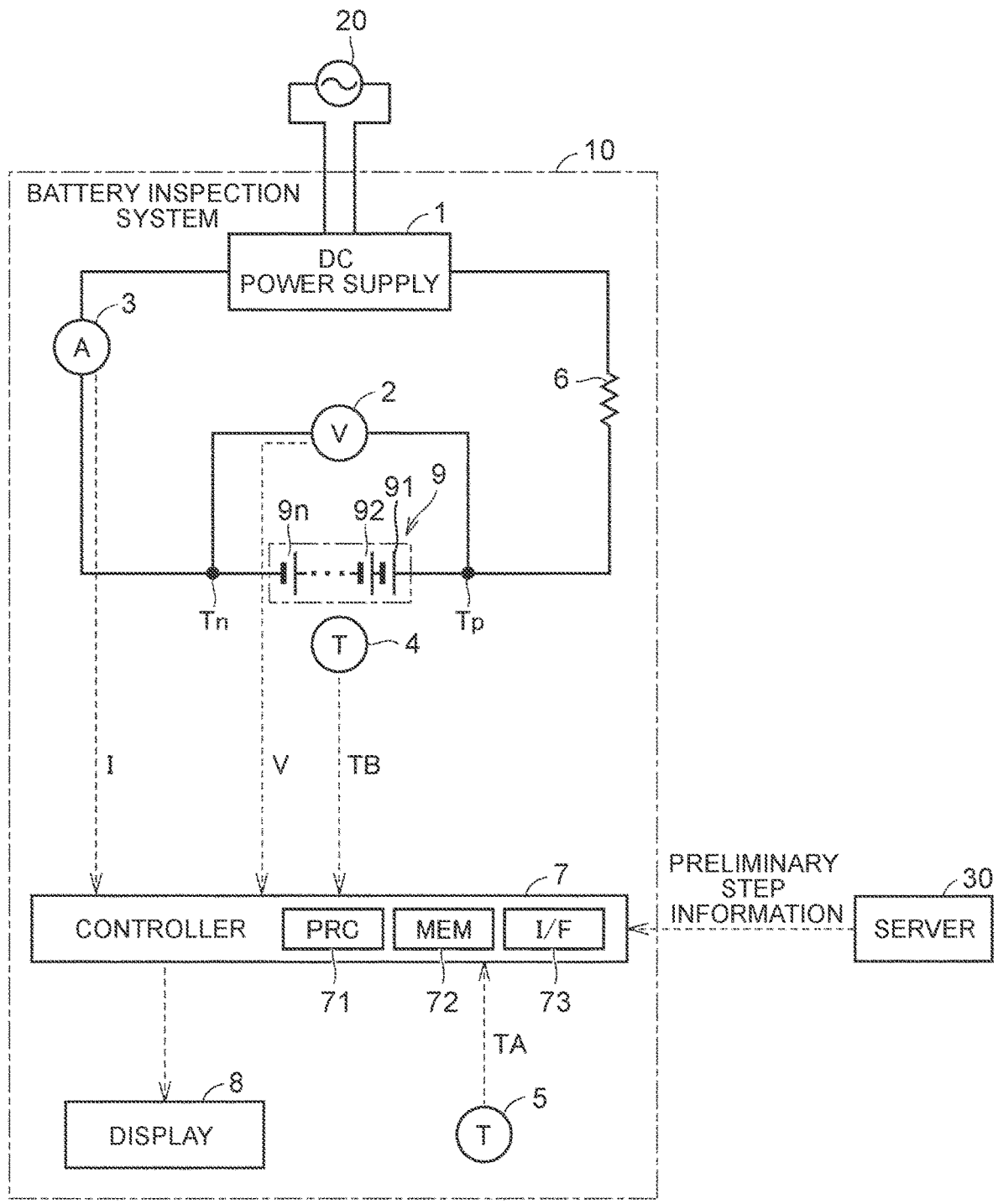
FIG. 1 is a configuration diagram of a battery inspection system according to an embodiment of the present disclosure.

Hereinafter, embodiments of the present disclosure will be described in detail with reference to the drawings. In the drawings, the same or corresponding parts are denoted by the same reference numerals, and the description thereof will not be repeated.

Embodiments

<Overall System Configuration>

FIG. 1 is a configuration diagram of a battery inspection system according to an embodiment of the present disclosure. The battery inspection system 10 includes a connection terminal Tp,Tn. The connection terminal Tp,Tn is configured to be electrically connectable to the battery 9 to be inspected. The battery 9 is usually a freshly manufactured new battery. The battery inspection system 10 performs an inspection for determining whether a short-circuit failure has occurred in the battery 9.

The battery 9 is a battery pack including a plurality of cells 91 to 9n connected in series. The number n of cells is typically several tens. In the present embodiment, each of the cells 91 to 9n is a lithium ion battery. However, the type of battery that can be inspected is not limited to the lithium ion secondary battery. In addition, the battery 9 may be a single cell instead of the assembled battery.

The battery inspection system 10 further includes a DC power supply 1, a voltage sensor 2, a current sensor 3, a battery temperature sensor 4, an ambient temperature sensor 5, an external resistor 6, a controller 7, and a display 8. The controller 7 includes a processor 71, a memory 72, and an input/output interface 73.

The DC power supply 1 is configured to charge and discharge the battery 9 in accordance with a control command from the controller 7. The DC power supply 1 is, for example, an AC/DC converter. The DC power source 1 converts AC power supplied from an external AC power source (e.g., commercial power source) 20 into DC power. The DC power supply 1 is also capable of boosting/lowering the voltage of the DC power in accordance with a control command from the controller 7.

The voltage sensor 2 is electrically connected between the connection terminal Tp and the connection terminal Tn. That is, the voltage sensor 2 is connected in parallel to the battery 9. The voltage sensor 2 detects an inter-terminal voltage (voltage V) of the battery 9, and outputs the detection result to the controller 7.

The current sensor 3 is electrically connected between the DC power supply 1 and the connection terminal Tn. That is, the current sensor 3 is connected in series to the battery 9. The current sensor 3 detects the current I flowing through the battery 9 and outputs the detection result to the controller 7.

The battery temperature sensor 4 detects the temperature of the battery 9 (the battery temperature TB) and outputs the detection result to the controller 7.

The ambient temperature sensor 5 detects an ambient temperature (ambient temperature TA) surrounding the battery 9, and outputs the detection result to the controller 7.

The external resistor 6 is electrically connected between the DC power supply 1 and the connection terminal Tp. The resistance value of the external resistor 6 affects the self-discharge current. The smaller the resistance value of the external resistor 6 is, the faster the convergence of the self-discharge current becomes. Therefore, the resistance value of the external resistor 6 is appropriately set in accordance with the magnitude of the self-discharge current to be adjusted (or the convergence time of the self-discharge current).

The processor 71 is, for example, a Central Processing Unit (CPU). The processor 71 controls charging and discharging of the battery 9 by controlling the DC power supply 1. Further, the processor 71 determines the presence or absence of a short-circuit failure of the battery 9 based on the magnitude of the self-discharge current. More specifically, the processor 71 determines that the battery 9 is normal when the convergence value of the self-discharge current is smaller than the reference value, and determines that a short-circuit failure has occurred in the battery 9 when the convergence value is larger than the reference value.

Memory 72 includes Read Only Memory (ROMs) and Random Access Memory (RAMs). The memory 72 stores a program to be executed by the processor 71, and also stores a map used for determining a short-circuit failure of the battery 9. The method of creating this map will be described in detail later.

The input/output interface 73 is communicably connected to the outside of the controller 7. The input/output interface 73 receives "preliminary step information" from the external server 30. The preliminary step information is information indicating an execution condition of the preliminary step performed prior to the self-discharge process of the battery 9. The preliminary step information will also be described in detail later. Further, the input/output interface 73 outputs a determination result of the presence or absence of a short-circuit failure of the battery 9 to the display 8.

<Cell Configuration>

Figure 2:
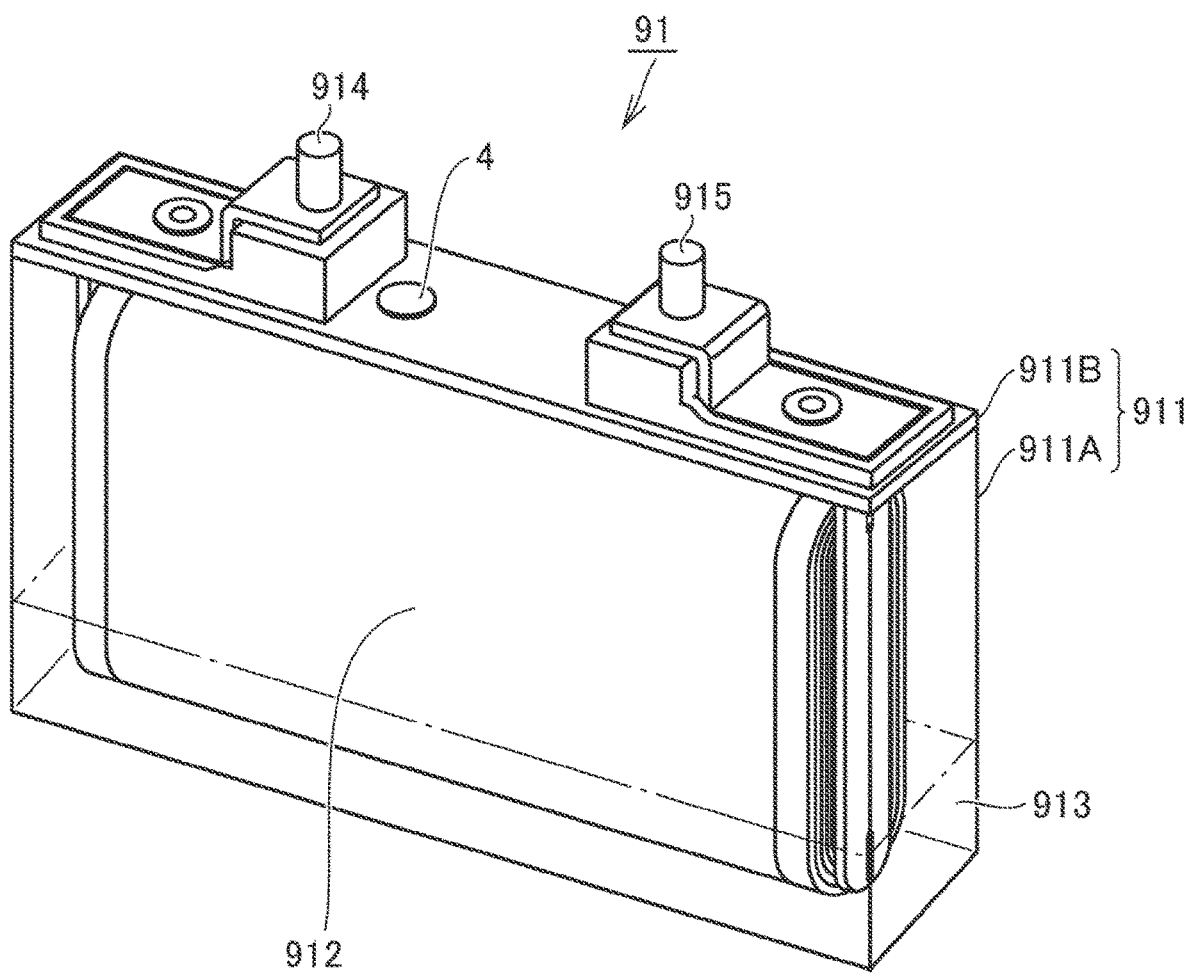
FIG. 2 is a perspective view illustrating an example of a configuration of a cell included in a battery.

FIG. 2 is a perspective view illustrating an example of a configuration of a cell included in the battery 9. Since the configurations of the cells 91 to 9n are the same, the configuration of the cell 91 will be described as a representative example. FIG. 2 shows a perspective view of the inside of the cell 91. The cell 91 is in this example a closed square battery. The cell 91 includes a battery case 911, an electrode assembly 912, and an electrolyte 913.

The battery case 911 is made of, for example, an aluminum (Al) alloy. The battery case 911 includes a case main body 911A and an upper surface member 911B. The case body 911A contains the electrode assembly 912 and the electrolyte 913. The electrode assembly 912 is, for example, a wound type. That is, the positive electrode and the negative electrode are alternately stacked while sandwiching a separator (neither of which is shown) therebetween, thereby forming a laminate. Further, the laminated body is wound in a cylindrical shape. The electrolyte 913 (the liquid surface is indicated by a chain line) is injected into the battery case 911 and permeates the electrode assembly 912. The upper surface member 911B is provided with a positive electrode terminal 914 and a negative electrode terminal 915. The battery temperature sensor 4 is disposed between the positive electrode terminal 914 and the negative electrode terminal 915, for example.

As the positive electrode active material layer, the negative electrode active material layer, the separator, and the electrolyte 913, materials conventionally known as a positive electrode active material, a negative electrode active material, a separator, and an electrolyte of a lithium ion battery can be used. As an example, a ternary material (NCM) in which a part of lithium cobaltate is substituted with nickel and/or manganese can be used as the positive electrode active material layer. Graphite can be used for the negative electrode active material layer. A polyolefin (for example, polyethylene or polypropylene) can be used as the separator. The electrolyte includes an organic solvent (such as a mixed solvent of dimethylcarbonate (DMC) and ethylmethylcarbonate (EMC) and ethylenecarbonate (EC)), a lithium salt (such as $LiPF_6$), and an additive (LiBOB (lithiumbis (oxalate) borate) or $Li[PF_2 (such as C_2O_4)_2]$).

<Temperature Fluctuation>

The short-circuit failure of the battery to be inspected is inspected based on the convergence value of the self-discharge current of the battery. When the convergence value of the self-discharge current is less than the reference value, the battery is determined to be normal. On the other hand, when the convergence value is equal to or greater than the reference value, it is determined that a short-circuit failure has occurred in the battery. During such an inspection, the ambient temperature (e.g., the air-conditioning temperature) may change, and accordingly the temperature of the battery may fluctuate.

Figure 3:
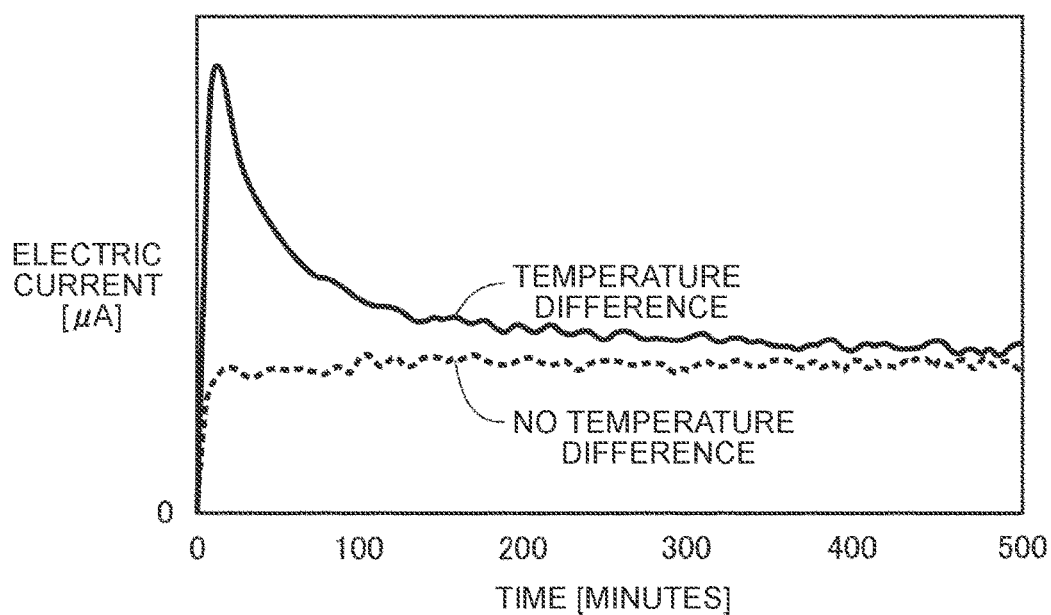
FIG. 3 is a diagram for explaining an influence of a change in the ambient temperature on the behavior of the self-discharge current.

FIG. 3 is a diagram for explaining an influence of a change in the ambient temperature on the behavior of the self-discharge current. The horizontal axis represents elapsed time. The vertical axis represents the self-discharge current. In FIG. 3, the behavior of the self-discharge current when the temperature difference between the ambient temperature TA and the battery temperature TB occurs is indicated by a solid line, and the behavior of the self-discharge current when the temperature difference does not occur is indicated by a broken line.

In the absence of a temperature difference, the self-discharge current generally converges in the order of several tens of minutes (in this example, about 30 minutes). On the other hand, if a temperature difference occurs, convergence of the self-discharge current may take several hundreds of minutes (about 450 minutes in this example). As described above, when the temperature difference occurs, the self-discharge current is less likely to converge, and the inspection time may become longer. Alternatively, if the inspection time is fixed, the self-discharge current may not be sufficiently converged, and the inspection accuracy may be lowered.

Therefore, in the present embodiment, a configuration is adopted in which various parameters (explanatory variables) that can affect the convergence of the self-discharge current are specified, and a correspondence between the explanatory variables and the convergence value of the self-discharge current is obtained in advance and mapped. This map is referred to as a "convergence value map". The convergence value map includes, as explanatory variables, a voltage V, a current I, a battery temperature TB, and an ambient temperature TA of the battery at a time point when a predetermined time has elapsed in the self-discharge process, as well as an execution condition of the preliminary step rather than the self-discharge process. The explanatory variable representing the execution condition of the preliminary step is referred to as "preliminary step information". First, the entire flow of the inspection process of the battery 9 is schematically described, and then the details of the preliminary step information are described.

<Overall Inspection Process>

Figure 4:
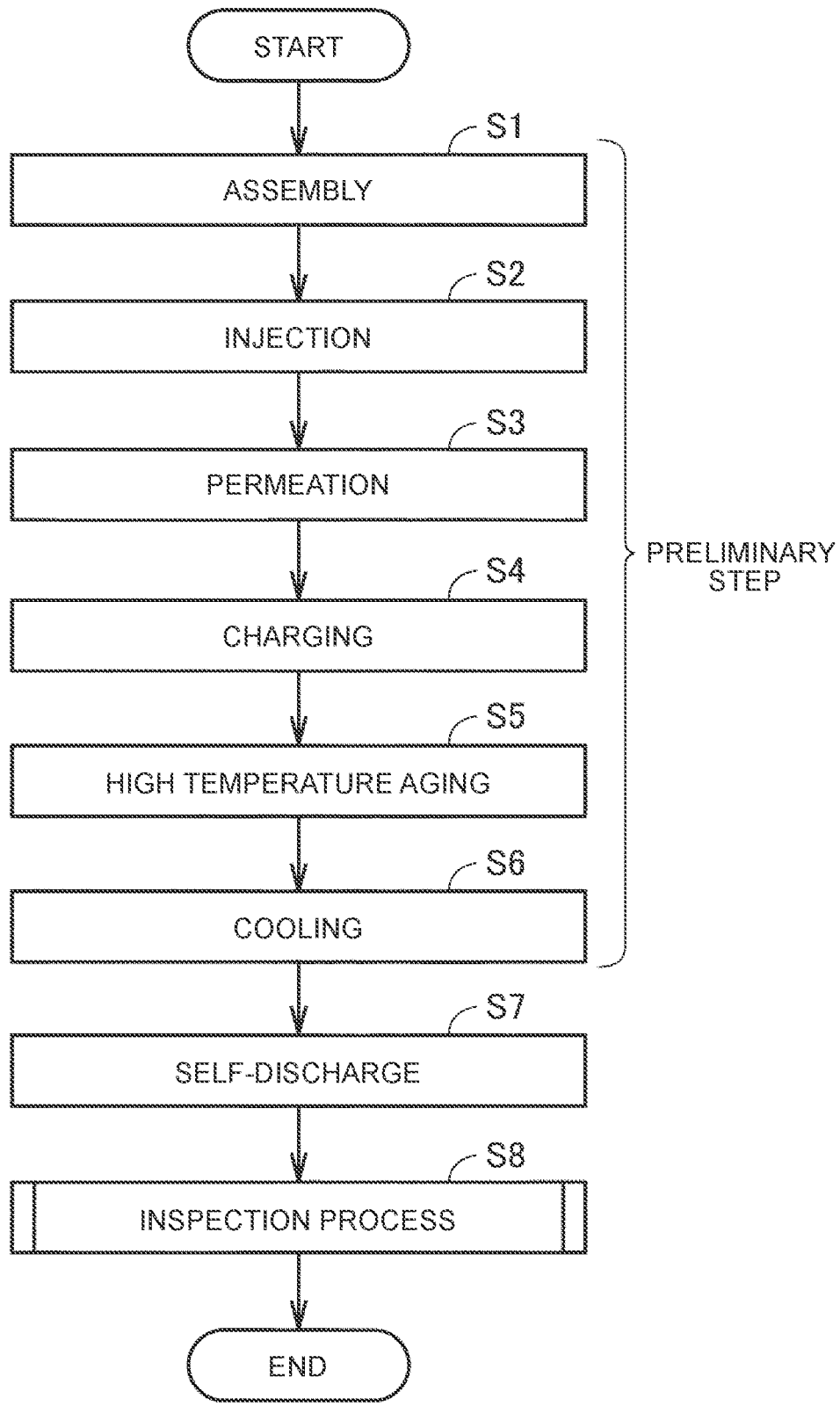
FIG. 4 is a flowchart illustrating an overall flow of a battery inspection process.

FIG. 4 is a flowchart illustrating an overall flow of a battery inspection process. Hereinafter, the step is abbreviated as S. The following steps S1 to S6 correspond to a preliminary step of the self-discharge step, and are mainly performed by an inspection person in charge. S7,S8 is performed by the battery inspection system 10.

In S1, the battery 9 is assembled (assembly step). More specifically, in the assembly process, the electrode assembly 912 (see FIG. 2) is manufactured from the positive electrode, the negative electrode, and the separator. In addition, the positive electrode terminal 914, the negative electrode terminal 915, the positive electrode current collector terminal, and the negative electrode current collector terminal (not shown) are assembled to the cover member to manufacture the upper surface member 911B. Then, the electrode assembly 912 is welded to the upper surface member 911B. The welded electrode assembly 912 is accommodated in the case body 911A. Thereafter, the opening edge portion of the case main body 911A and the outer peripheral edge portion of the upper surface member 911B are laser-welded.

In S2, the electrolyte 913 is injected from a liquid injection port (not shown) provided on the upper surface member 911B of the battery case 911 for a predetermined time (injection time) (liquid injection step). After the electrolyte is injected, the battery case 911 is sealed by a sealing member (not shown).

In S3, the injected electrolyte 913 spreads over the entire surface of the electrode assembly 912. Thereafter, the electrolyte 913 on the surface of the electrode assembly 912 permeates the inside of the electrode assembly 912 for a certain period of time (permeation time) (permeation step).

At S4, the battery 9 is connected to a charger (not shown). The battery 9 is charged until a predetermined SOC (State Of Charge) is reached (charging step). In the present embodiment, the battery temperature TB at the time of charging, the ambient temperature TA at the time of charging, and the voltage V of the battery 9 at the time of the end of charging can be measured. Further, the battery 9 stays for a predetermined period of time from the permeation process to the charging process. This residence time can also be measured.

In S5, the charged battery 9 is installed in a thermostatic bath (not shown) maintained at a high temperature. High temperature aging in the thermostatic bath is performed for a predetermined time (high temperature aging time) of about several hours (high temperature aging step). In the present embodiment, the battery temperature TB and/or the ambient temperature TA in the high temperature aging step can be measured. The residence time of the battery 9 from the charging process to the high temperature aging process can also be measured.

In S6, the battery 9 after the high temperature aging is left in an environment at room temperature (typically 25° C.) for a certain period of time (cooling time), such as a whole day, and is cooled (cooling step). In the present embodiment, the battery temperature TB in the cooling step can be measured.

In S7, the cooled battery 9 is installed in the battery inspection system 10. The battery inspection system 10 measures a self-discharge current until a predetermined time elapses (a self-discharge process). More specifically, the battery inspection system 10 first acquires the voltage of the battery 9 in a state where no current flows in the battery 9, that is, the open-circuit voltage (Open Circuit Voltage (OCV)) of the battery 9, from the voltage sensor 2. Then, the battery inspection system 10 sets the supply voltage of the DC power supply 1 to a value equal to the OCV of the battery 9. In order to accelerate the convergence of the self-discharge current, the supply voltage of the DC power supply 1 may be set to a value higher than the OCV of the battery 9. Thereafter, over time, the voltage V of the battery 9 decreases due to self-discharge of the battery 9. Then, a voltage difference occurs between the supply voltage from the DC power supply 1 and the voltage of the battery 9. The self-discharge current flows due to the voltage difference, and the current value is measured by the current sensor 3. Further, in the present embodiment, the battery inspection system 10 measures, in addition to the self-discharge current, the voltage V, the battery temperature TB, and the ambient temperature TA at the time when the predetermined time has elapsed. The residence time of the battery 9 from the cooling step to the self-discharge step can also be measured.

In S8, the battery inspection system 10 compares the convergence value of the self-discharge current in S7 with the reference value to determine the quality (presence or absence of a short-circuit defect) of the battery 9 (inspection processing). Note that all of the preliminary step illustrated in FIG. 4 are not necessarily essential, and some steps (any of the steps S4 to S6) may be omitted.

<Preliminary Step Information>

FIG. 5 is a diagram for explaining preliminary step information. As the preliminary step information, at least one of the explanatory variables shown in FIG. 5 can be used. That is, only a single explanatory variable may be used, or two or more explanatory variables may be used in combination.

The explanatory variables associated with the assembly process include electrode (positive and negative electrode) materials, electrode thickness, electrode weight, electrode moisture content, positive and negative electrode capacity ratios, and separator materials. The explanatory variables related to the injection process include an electrolyte material, an injection amount of the electrolyte, and an injection time of the electrolyte. The explanatory variables associated with the permeation step include the permeation time. The explanatory variables related to the charging step include a residence time (first residence time) from the permeation step to the charging step, a battery temperature TB in the charging step, an ambient temperature TA in the charging step, and a voltage V of the battery 9 at the end of charging. The explanatory variables related to the high temperature aging step include a residence time (second residence time) from the charging step to the high temperature aging step, a high temperature aging time, a battery temperature TB during the high temperature aging, and an ambient temperature TA during the high temperature aging. The explanatory variables related to the cooling step include a cooling time, a residence time from the cooling step to the self-discharge step (third residence time), and a battery temperature TB in the cooling step.

The electrode material, the electrode thickness, and the like of the preliminary step information (the above-described explanatory variables) are known from the specifications of the battery 9 and the like. Known preliminary step information is registered in advance in the server 30. On the other hand, the residence time from the permeation step to the charging step is measured by the person in charge of the inspection during the execution of the corresponding step. Then, the person in charge of inspection inputs the measured preliminary step information to a terminal (not shown), and the input preliminary step information is collected in the server 30 (see FIG. 1). Therefore, the battery inspection system 10 can acquire desired preliminary step information by communicating with the server 30.

<Convergence Value Map>

FIG. 6 is a conceptual diagram of a convergence value map. As described above, in the convergence value map, a correspondence between the voltage V, the current I, the battery temperature TB, and the ambient temperature TA of the battery at the time when the predetermined time has elapsed in the self-discharge process, the preliminary step information, and the convergence value of the self-discharge current is defined. Hereinafter, a method of creating a convergence value map will be described.

Similarly to the battery inspection system 10, a system (not shown) capable of measuring a self-discharge current is installed in a thermostat maintained at room temperature (25° C.). A number of batteries of the same type as the battery 9 are prepared. The air-conditioning temperature of the room in which the battery is located can be changed to various values within a temperature range including room temperature (e.g., within a range of 25° C.±several ° C.).

When the battery is left for a certain period of time, the battery temperature TB approaches the air-conditioning temperature. The self-discharge current of the battery in which the battery temperature TB becomes approximately isothermal in the air-conditioning temperature is measured in the temperature chamber. More specifically, the voltage V, the current I (convergence value of the self-discharge current), the battery temperature TB, and the ambient temperature TA (=set temperature of the thermostat) are measured at a time point when a predetermined time (for example, 100 minutes) longer than the time required for convergence of the self-discharge current elapses from the start of the self-discharge. As the convergence value of the self-discharge current, an average value within a period in which the variation of the current I becomes smaller than a predetermined value can be used. By setting different air-conditioning temperatures for each battery, the convergence value of the self-discharge current under various temperature conditions can be measured. The obtained measurement result is managed in association with the preliminary step information.

Subsequently, data cleansing is performed on the obtained measurement results. Specifically, an outlier of the convergence value of the self-discharge current is removed, or the data balance between the temperature conditions is adjusted.

Thereafter, the data (the correspondence between the measurement result at the time when the predetermined time has elapsed in the self-discharge process, the preliminary step information, and the convergence value of the self-discharge current) is organized using a known regression method. Machine learning may be used to organize data. When using machine learning, gradient boosting tree (Gradient Boosted Trees) regression, rule-fit (Rule Fit) regression, random forest (Random Forest) regression, etc. can be used. Thus, a convergence value map is created. The generated convergence value map is stored in the memory 72 of the controller 7 of the battery inspection system 10.

The convergence value map corresponds to a "correspondence" according to the present disclosure. The "correspondence" according to the present disclosure is not limited to a map, and may be a data table, a function, a relational expression, or the like.

<Inspection Processing>

FIG. 7 is a flowchart illustrating a processing procedure of the inspection processing (step S8). This flowchart is executed when a predetermined condition is satisfied (for example, when an inspection person performs an operation for instructing the start of processing). Each step is realized by software processing by the controller 7 (processor 71), but may be realized by hardware (electric circuit) arranged in the controller 7.

As described above, the preliminary step information is collected in the server 30. In S81, the controller 7 acquires, from the server 30, the preliminary step information regarding the battery 9 to be inspected.

In S82, the controller 7 acquires, from the corresponding sensor, a voltage V, a current I, a battery temperature TB, and an ambient temperature TA at a time point when a predetermined time (the same length as the time used in the convergence value map, for example, 100 minutes) has elapsed since the start of the self-discharge.

In S83, the controller 7 refers to the convergence value map stored in the memory 72, and calculates the convergence value of the self-discharge current corresponding to the value acquired in S82.

In S84, the controller 7 determines whether the calculated convergence value is less than a predetermined reference value. When the convergence value is less than the reference value (YES in S84), the controller 7 determines that the battery 9 to be inspected is non-defective (normal) (S85). On the other hand, when the convergence value is equal to or greater than the reference value (NO in S84), the controller 7 determines that the battery 9 to be inspected is a defective product (a short-circuit defect has occurred) (S86). Thereafter, the controller 7 displays the determination result on the display 8 (S87).

As described above, in the present embodiment, the convergence value of the self-discharge current is calculated using the convergence value map. The convergence value map includes the preliminary step information in addition to the voltage V, the current I, the battery temperature TB, and the ambient temperature TA at the time when the predetermined time has elapsed since the start of the self-discharge.

According to studies by the present inventors, since the convergence value map includes the preliminary step information, it is possible to accurately predict the behavior of the self-discharge current even if the ambient temperature (such as the air-conditioning temperature) fluctuates. Therefore, according to the present embodiment, it is possible to appropriately inspect the short-circuit failure of the battery 9 even when there is a temperature variation of the battery 9 to be inspected. As a result, it is also possible to shorten the inspection time.

It should be considered that the embodiment described herein is just an example in all respects and is not limitative. It is intended that the scope of the disclosure be defined by the appended claims rather than the description of the embodiments described above, and that all changes within the meaning and range of equivalency of the claims be embraced therein.

What is claimed is:

1. A battery inspection method comprising:
    self-discharging a battery to be inspected until a predetermined time has elapsed from a start of self-discharge;
    detecting a voltage, a current, and a temperature of the battery and an ambient temperature at a time when the predetermined time has elapsed;
    performing a preliminary step prior to self-discharge of the battery;
    acquiring preliminary step information representing an execution condition of the preliminary step;
    calculating a current convergence value from the acquired preliminary step information, the detected voltage, the detected current, the detected temperature, and the detected ambient temperature by referring to a predetermined correspondence between the preliminary step information, the voltage, the current, and the temperature of the battery, and the ambient temperature at the time when the predetermined time has elapsed, and the current convergence value; and
    determining whether a short circuit failure of the battery is occurring based on the calculated current convergence value, wherein
    performing the preliminary step includes:
        injecting an electrolyte into a case containing an electrode assembly, and
        causing the injected electrolyte to permeate the electrode assembly.

2. The battery inspection method according to claim 1, wherein the preliminary step information includes at least one of
    a material of the electrolyte,
    an injection amount of the electrolyte,
    an injection time for injecting the electrolyte into the battery, and
    a permeation time for causing the electrolyte to permeate the electrode assembly.

3. The battery inspection method according to claim 1, wherein performing the preliminary step further includes charging the battery after permeation of the electrolyte into the electrode assembly.

4. The battery inspection method according to claim 3, wherein the preliminary step information includes at least one of
    a first residence time from permeation of the electrolyte to charging of the battery,
    the temperature of the battery when charging the battery,
    the ambient temperature when charging the battery, and the voltage of the battery at an end of charging of the battery.

5. The battery inspection method according to claim 3, wherein performing the preliminary step further includes performing high temperature aging of the battery after the battery is charged.

6. The battery inspection method according to claim 5, wherein the preliminary step information includes at least one of
a second residence time from charging the battery to performing the high temperature aging,
an execution time of the high temperature aging,
a temperature of the battery in the high temperature aging, and
an ambient temperature in the high temperature aging.

7. The battery inspection method according to claim 5, wherein performing the preliminary step further includes cooling the battery after performing the high temperature aging.

8. The battery inspection method according to claim 7, wherein the preliminary step information includes at least one of
a cooling time of the battery, and
a temperature of the cooled battery.

9. The battery inspection method according to claim 1, wherein the battery includes a positive electrode, a negative electrode, and a separator, and
wherein the preliminary step information includes at least one of
a material of the positive electrode and the negative electrode,
a thickness of the positive electrode and the negative electrode,
a basis weight of the positive electrode and the negative electrode,
a water content of the positive electrode and the negative electrode,
a capacitance ratio between the positive electrode and the negative electrode, and
a material of the separator.

10. A battery inspection system configured to inspect a short circuit failure of a battery in which a preliminary step is performed in accordance with preliminary step information, the preliminary step includes injecting an electrolyte into a case containing an electrode assembly, and causing the injected electrolyte to permeate the electrode assembly, the battery inspection system comprising:
a voltage sensor that detects a voltage of the battery;
a current sensor that detects a current flowing through the battery;
a battery temperature sensor that detects a temperature of the battery;
an ambient temperature sensor that detects an ambient temperature;
a memory that stores a predetermined correspondence between the preliminary step information, the voltage, the current, and the temperature of the battery at a time when a predetermined time has elapsed from a start of self-discharge, the ambient temperature, and a current convergence value; and
a processor that determines whether the short circuit failure of the battery is occurring,
wherein the processor is configured as to:
acquire the preliminary step information;
acquire the voltage, the current, and the temperature of the battery, and the ambient temperature at a time when a predetermined time has elapsed since the self-discharge of the battery is started;
calculate the current convergence value from the acquired preliminary step information, the detected voltage, the detected current, the detected temperature, and the detected ambient temperature by referring to the correspondence; and
determine whether the short circuit failure of the battery is occurring based on the calculated current convergence value.

* * * * *